US011616483B2

(12) United States Patent
Choi

(10) Patent No.: US 11,616,483 B2
(45) Date of Patent: Mar. 28, 2023

(54) APPARATUS FOR PREVENTING BACK INTRODUCTION OF ELECTROMAGNETIC WAVE NOISE INTO IGNITION SYSTEM

(71) Applicant: HYUNDAI MOBIS Co., Ltd., Seoul (KR)

(72) Inventor: Jae Won Choi, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 0 days.

(21) Appl. No.: 17/534,915

(22) Filed: Nov. 24, 2021

(65) Prior Publication Data
US 2022/0166400 A1    May 26, 2022

(30) Foreign Application Priority Data

Nov. 25, 2020  (KR) ................. 10-2020-0160542

(51) Int. Cl.
*H03H 7/01* (2006.01)
*B60L 53/60* (2019.01)
*H02M 3/04* (2006.01)
*H02M 1/44* (2007.01)

(52) U.S. Cl.
CPC ............ *H03H 7/0115* (2013.01); *B60L 53/60* (2019.02); *H02M 1/44* (2013.01); *H02M 3/04* (2013.01); *B60L 2270/147* (2013.01)

(58) Field of Classification Search
CPC ............. H03H 7/0115; B60L 2270/147; B60L 3/0069; F02P 3/0876; F02P 3/08; F02P 3/04; H02M 1/44; H02M 1/126; Y02T 10/40
See application file for complete search history.

(56) References Cited

U.S. PATENT DOCUMENTS

| | | | | |
|---|---|---|---|---|
| 4,327,702 A | * | 5/1982 | Imai | H01T 13/50 123/655 |
| 4,345,576 A | * | 8/1982 | Moseley | F02P 15/10 123/604 |
| 2015/0171817 A1 | * | 6/2015 | Sun | B60R 16/02 307/9.1 |
| 2020/0079233 A1 | * | 3/2020 | Kim | H03H 7/06 |

FOREIGN PATENT DOCUMENTS

KR    2001064933 A  *  7/2001  ............ F02P 15/001

* cited by examiner

*Primary Examiner* — Ryan Johnson
(74) *Attorney, Agent, or Firm* — Morgan, Lewis & Bockius LLP

(57) ABSTRACT

An apparatus, as an electromagnetic wave back introduction blocking module connected between an ignition (IG) system and a converter, includes a front capacitor module which includes a first coil part including one or more coils having one side connected to the IG system in series and a first capacitor part connected between the other side of the first coil part and a ground, a central coil module which includes a second coil part including one or more coils having one side connected to the other side of the first coil part and a second capacitor part connected between the other side of the second coil part and the ground, and a rear capacitor module which includes a third capacitor part having one side connected to the other side of the second coil part. The rear capacitor module is connected to the converter.

8 Claims, 5 Drawing Sheets

APPARATUS FOR PREVENTING BACK INTRODUCTION OF ELECTROMAGNETIC WAVE NOISE INTO IGNITION SYSTEM

CROSS-REFERENCE TO RELATED APPLICATION

This application claims priority to and the benefit of Korean Patent Application No. 10-2020-0160542, filed on Nov. 25, 2020, the disclosure of which is incorporated herein by reference in its entirety.

BACKGROUND

1. Field of the Invention

The present invention relates to an apparatus for blocking electromagnetic waves in a vehicle ignition (IG) system, and more particularly, to an apparatus for preventing back introduction of electromagnetic wave noise into an IG system.

2. Discussion of Related Art

Mild hybrid electric vehicles (MHEVs), which have improved fuel efficiency and low environmental pollution at a relatively low price, are receiving attention as regulations on vehicle fuel efficiency are strengthened due to the introduction of eco-friendly policies worldwide. In particular, among the MHEVs, an MHEV 48V system is receiving more attention in terms of safety and cost. The MHEV 48V system is equipped with a converter that converts a generated power of 48 V into charging power for a 12V battery (hereinafter, referred to as a vehicle battery).

In this case, the vehicle battery receives power through the converter when an ignition (IG) system is turned on. Electromagnetic wave noise (hereinafter, referred to as IG noise) is introduced back from a ground and an external line of the IG system, thereby resulting in malfunction of electronic components of a vehicle and electronic components of a drive system. In order to solve a problem of the back introduction of IG noise into the IG system, there is an attempt to bypass the IG noise using a CLC filter or the like, but there is a problem in that more IG noise is introduced.

SUMMARY OF THE INVENTION

The present invention is directed to providing an apparatus for preventing back introduction of ignition (IG) noise, which prevents of back introduction of IG noise into a vehicle IG system.

An apparatus, as an electromagnetic wave back introduction blocking module connected between an ignition (IG) system and a converter for preventing back introduction of electromagnetic wave noise into the ignition (IG) system proposed in the present invention, includes a front capacitor module which includes a first coil part including one or more coils having one side connected to the IG system in series and a first capacitor part connected between the other side of the first coil part and a ground, a central coil module which includes a second coil part including one or more coils having one side connected to the other side of the first coil part and a second capacitor part connected between the other side of the second coil part and the ground, and a rear capacitor module which includes a third capacitor part having one side connected to the other side of the second coil part. The rear capacitor module is connected to the converter.

The first capacitor part may include at least two capacitors connected in parallel between the other side of the first coil part and the ground.

The third capacitor part may include at least two capacitors connected in parallel between the other side of the second coil part and the ground.

The converter may be a low voltage DC-DC converter (LDC).

The battery module may include at least one 12V battery.

The converter may support a mild hybrid electric vehicle (MHEV).

The front capacitor module, the central coil module, and the rear capacitor module may be arranged in series between the ignition (IG) system and the converter in an order of the front capacitor module, the central coil module, and the rear capacitor module.

The converter may be configured to convert direct current (DC) power for battery charging, and the electromagnetic wave back introduction blocking module may be configured to control an operation of transmitting direct current (DC) power for battery charging to the battery module from the converter.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
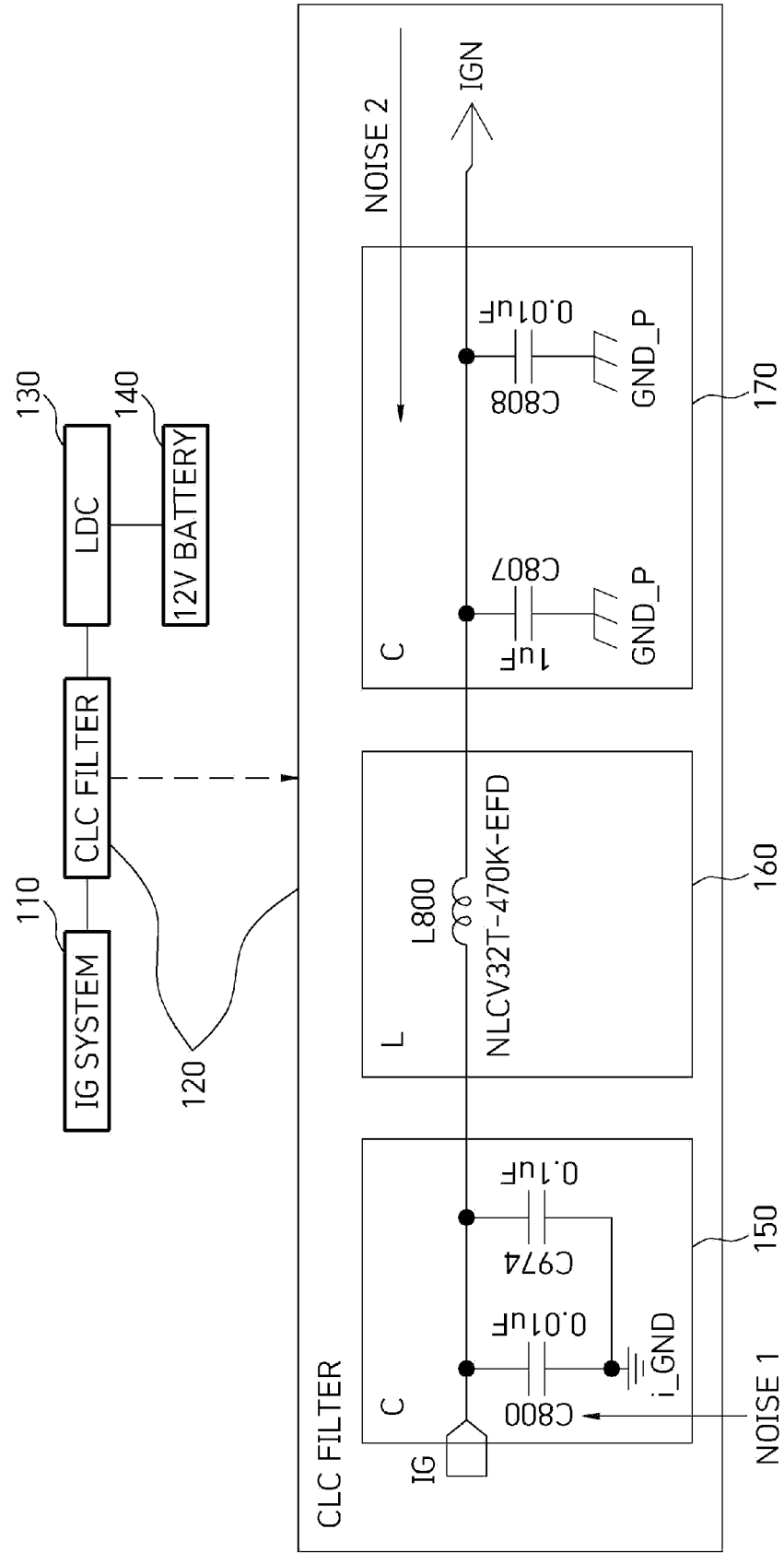
FIG. 1 is a block diagram for describing an apparatus for preventing back introduction of electromagnetic wave noise into an ignition (IG) system according to a related art.

The present invention may be variously modified and have various embodiments so that some embodiments will be illustrated in the accompanying and described in the detailed description. However, it is not intended to limit the present invention to specific embodiments, and it will be appreciated that the present invention includes all changes, modifications equivalences, or substitutions related to the embodiments and included in the spirit and the technical scope of the present invention.

Although the terms "first," "second," and the like are used herein to describe various elements, these elements should not be limited by these terms. The terms are used only for the purpose of distinguishing one element from another element. The term "and/or" includes any one or all combinations of a plurality of associated listed items.

It will be understood that when an element is referred to as being "connected" or "coupled" to another element, it can be directly connected or coupled to another element, or intervening elements may be present. It will be understood that only when an element is referred to as being "directly connected" or "directly coupled" to another element, intervening elements are not present.

It is to be understood that terms used herein are for the purpose of the description of provided embodiments and not for limitation. A singular expression includes a plural expression unless the context clearly indicates otherwise. It will be further understood that the terms "comprises" and/or "comprising," when used in this specification, specify the presence of stated features, integers, steps, operations, elements, components, and/or groups thereof but do not preclude the presence or addition of one or more other features, integers, steps, operations, elements, components, and/or groups thereof.

As used herein, the term "the" or other similar referring expressions may refer to both a singular form and a plural form. Also, when there is no description explicitly referring to orders of operations included in methods according to the present invention, the operations may be performed in an order for accomplishing the intended purpose. The present invention is not limited to the described orders of operations All terms including technical and scientific terms used herein have the same meaning as commonly understood by one of ordinary skill in the art to which the present invention belongs and should not be interpreted in an idealized or overly formal sense. When the meaning of a term in the present specification is defined, the term should be interpreted as defined.

Hereinafter, exemplary embodiments of the present invention will be described in more detail with reference to the accompanying drawings. In describing the present invention, in order to facilitate general understanding, the same reference numerals are used to denote the same elements throughout the drawings, and a redundant description of the same elements is omitted.

FIG. 1 is a block diagram for describing an apparatus for preventing back introduction of electromagnetic wave noise into an ignition (IG) system according to a related art.

Referring to FIG. 1, an IG system 110 is controlled to be turned on/off such that direct current (DC) power for battery charging supplied from a low voltage DC-DC converter (LDC) 130 is transmitted to a battery 140. That is, when the IG system 110 is turned on, the battery 140 receives DC power for charging from the LDC 130 and starts to be charged.

In this case, as described above, in the IG system 110, electromagnetic wave noise (that is, IG noise) is introduced back from a ground and/or a converter (for example, the LDC 130) of the IG system, thereby resulting in malfunction of electronic components of a vehicle and electronic components of a drive system. Thus, in order to solve a problem of the back introduction of the IG noise into the IG system, a CLC filter or the like is used to bypass the IG noise, but it has been pointed out that there is a problem in that more IG noise (that is, noise 1 from the ground and noise 2 from the converter as shown in FIG. 1) is introduced.

Figure 2:
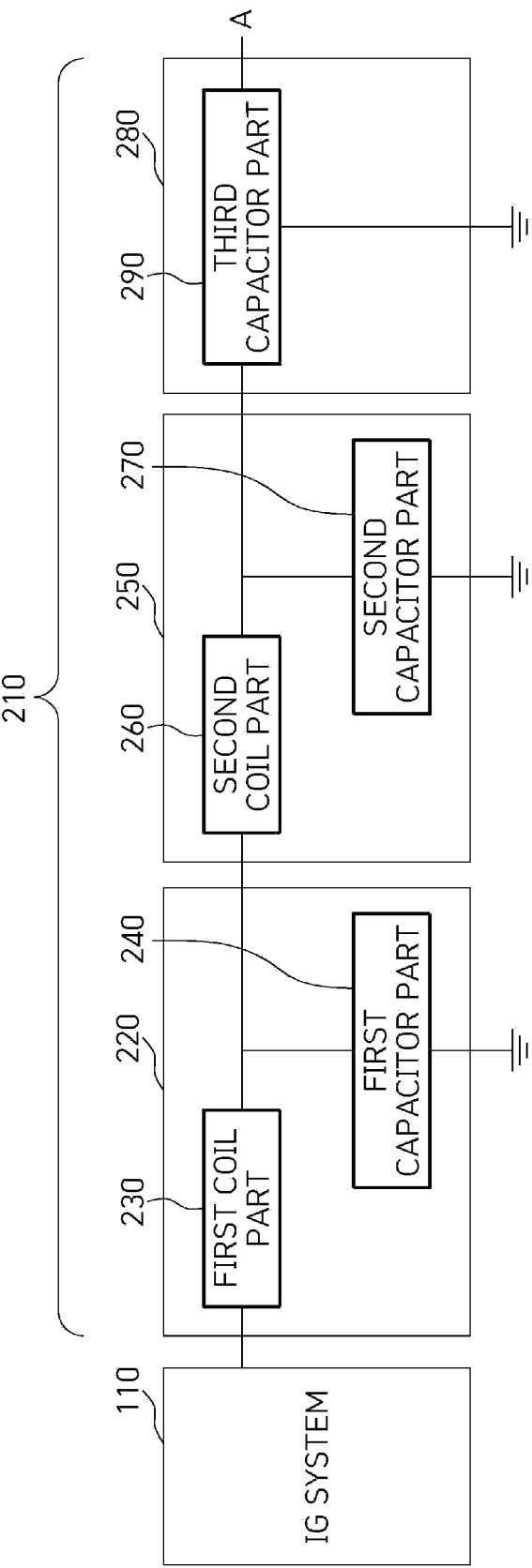
FIG. 2 is a conceptual diagram for describing an apparatus for preventing back introduction of electromagnetic wave noise into an IG system according to one embodiment of the present invention.

FIG. 2 is a conceptual diagram for describing an apparatus for preventing back introduction of electromagnetic wave noise to an IG system according to one embodiment of the present invention.

Referring to FIG. 2, an apparatus 210 for preventing back introduction of electromagnetic wave noise into an IG system according to one embodiment of the present invention includes a front capacitor module 220 which includes a first coil part 230 having one side connected to an IG system 110 in series and a first capacitor part 240 connected between the other side of the first coil part 230 and a ground, a central coil module 250 which includes a second coil part 260 having one side connected to the other side of the front capacitor module 220 and a second capacitor part 270 connected between the other side of the second coil part 260 and the ground, and a rear capacitor module 280 which includes a third capacitor part 290 having one side connected to the other side of the second coil part 260 and the other side A connected to a converter.

In this case, the first capacitor part 240 may include at least two capacitors connected in parallel between the other side of the first coil part 230 and the ground. The first coil part includes one or more coils connected in series.

The second capacitor part 270 includes one or more capacitors connected in parallel between the other side of the second coil part and the ground. The second coil part includes one or more coils connected in series.

The third capacitor part 290 may include at least two capacitors connected in parallel between the other side of the second coil part 260 and the ground. Microfarad capacitors may be used as the capacitors used in the first to third capacitor parts 240 to 290, millihenry coils (inductors) may be used as the coil used in the first coil part and the second coil part, and a capacitor and a coil having an optimum value at which back introduction of electromagnetic waves is minimized may be selected.

Figure 3:
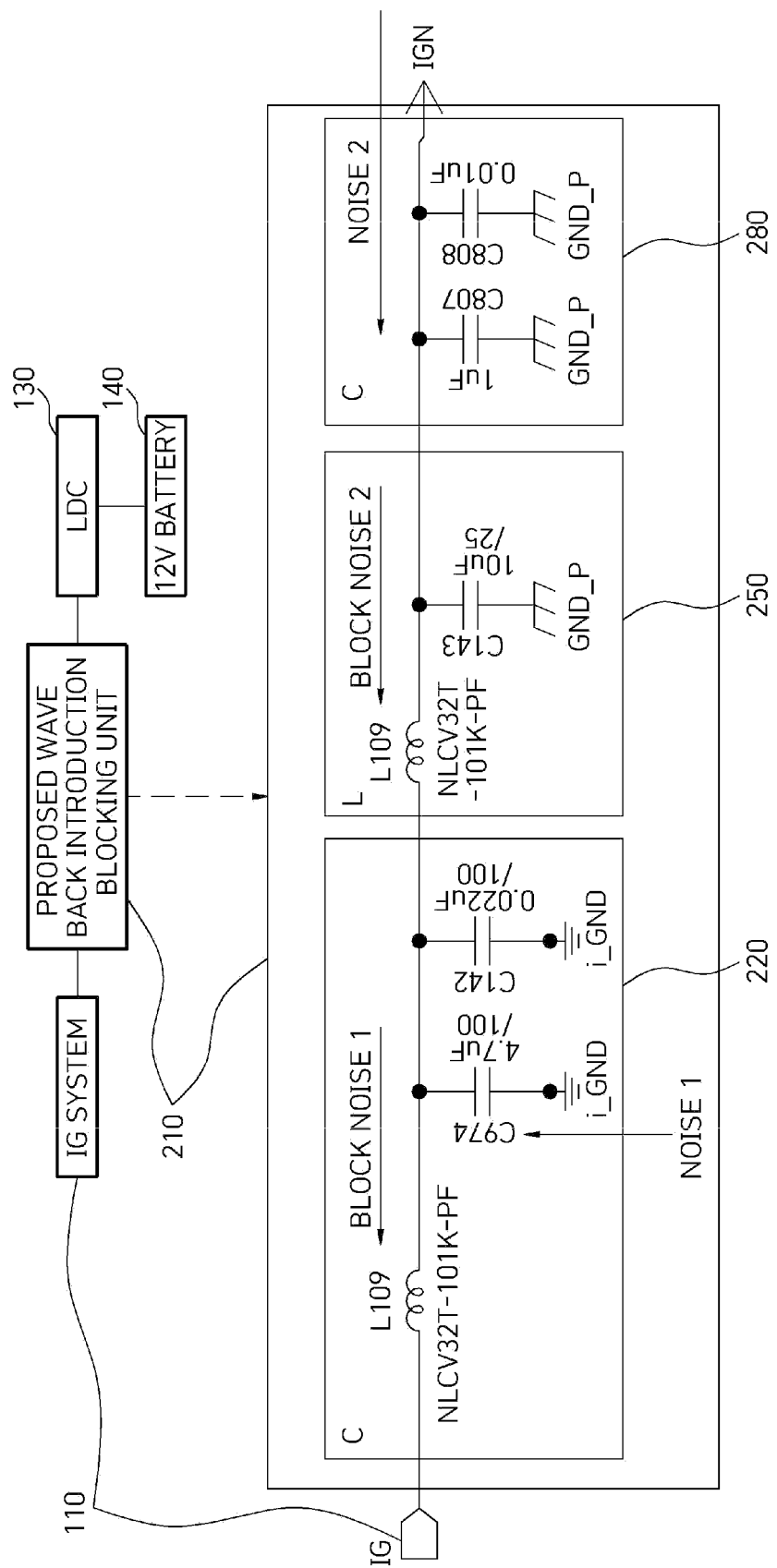
FIG. 3 is a block diagram for describing an apparatus for preventing back introduction of electromagnetic wave noise into an IG system according to another embodiment of the present invention.

FIG. 3 is a block diagram for describing an apparatus for preventing back introduction of electromagnetic wave noise into an IG system according to another embodiment of the present invention.

Referring to FIG. 3, the apparatus 210 for preventing back introduction of electromagnetic wave noise into an IG system according to another embodiment of the present invention represents a specific embodiment of the apparatus for preventing back introduction of electromagnetic wave noise into an IG system of FIG. 2.

In the apparatus 210 for preventing back introduction of electromagnetic wave noise into an IG system according to another embodiment of the present invention shown in FIG. 3, a first coil part of a front capacitor module 220 is implemented as one coil L109, and a first capacitor part of the front capacitor module 220 is implemented as two capacitors C974 and C142. In addition, a second coil part of a central coil module 250 is implemented as one coil L110, and a second capacitor part of the central coil module 250 is implemented as one capacitor C143. In addition, a third capacitor part of a rear capacitor module 280 is implemented as two capacitors C807 and C808. However, the apparatus for preventing back introduction of electromagnetic wave noise into an IG system according to the present invention is not limited thereto, and the numbers and application values of implemented capacitors and coils may be variously changed according to changes in an IG system and/or a converter which are to be connected.

Through such implementation, noise 1 introduced into the IG system through a ground connection portion of the first capacitor part of the front capacitor module 220 is blocked by the first coil part, and noise 2 introduced through the rear capacitor module 280 connected to an LDC 130 and the like is blocked by the second coil part and the second capacitor part of the central coil module 250.

Figure 4:
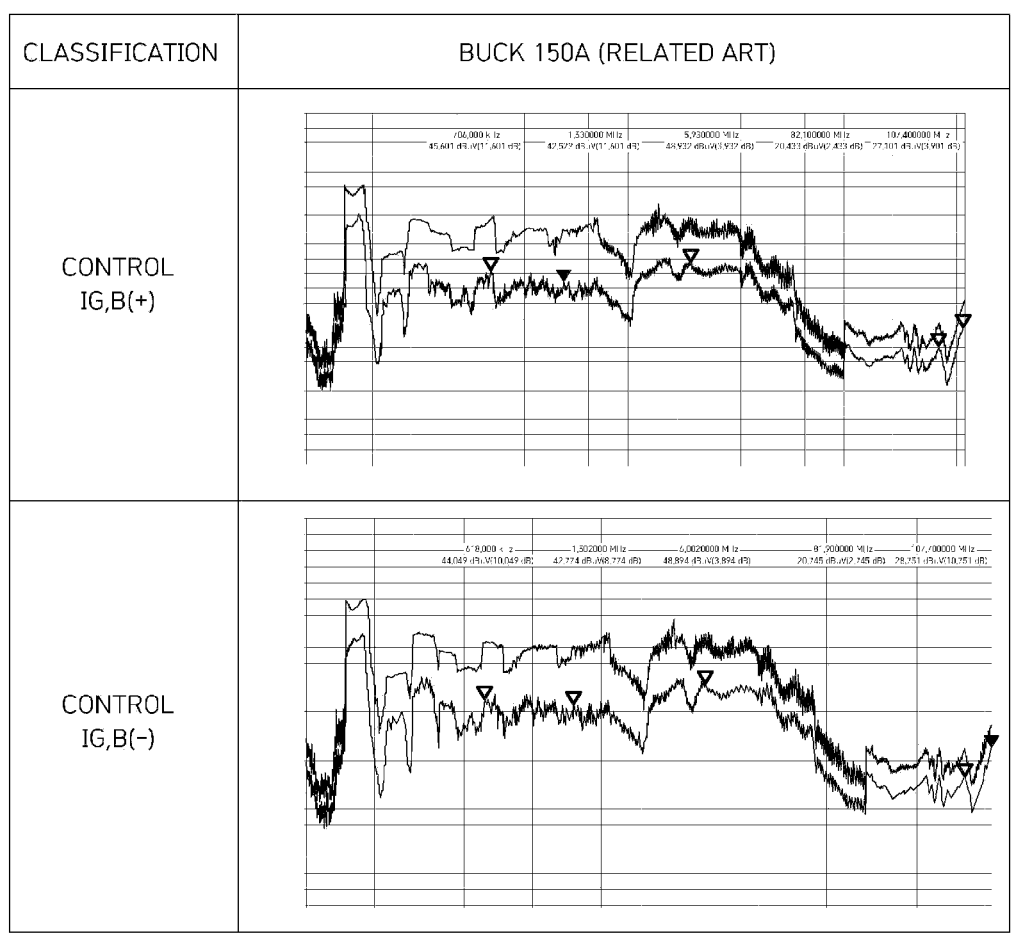
FIG. 4 is a diagram for describing an intensity level of electromagnetic wave noise generated for each band in the case of using a CLC in a related art.
Figure 5:
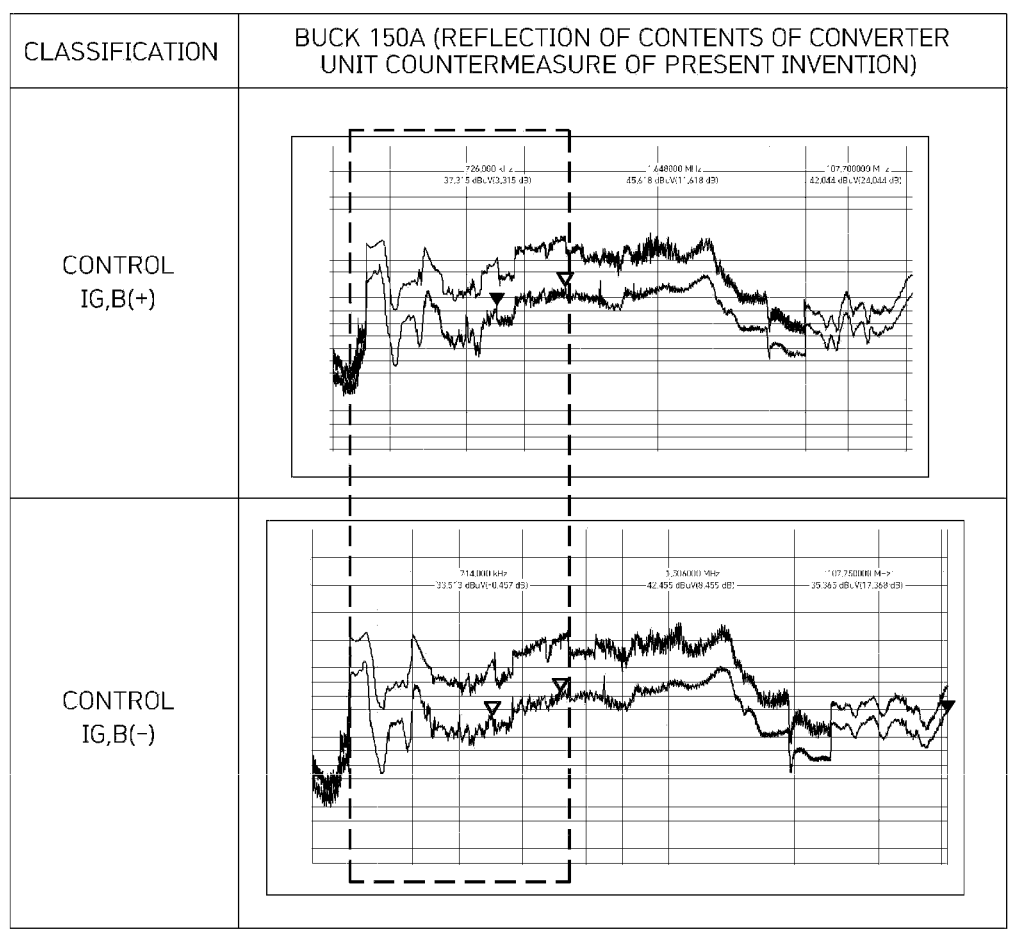
FIG. 5 is a diagram for describing an intensity level of electromagnetic wave noise generated for each band in the case of adopting an apparatus for preventing back introduction of electromagnetic wave noise into an IG system according to another embodiment of the present invention.

FIG. 4 is a diagram for describing an intensity level of electromagnetic wave noise generated for each band in the case of using a CLC in a related art. FIG. 5 is a diagram for describing an intensity level of electromagnetic wave noise generated for each band in the case of adopting an apparatus for preventing back introduction of electromagnetic wave noise into an IG system according to another embodiment of the present invention.

In general, when a 48V LDC is used, since electromagnetic wave noise is emitted therefrom, noise in a specific frequency band shown in Table 1 in an actual work place is managed to be introduced into an IG system at a level less than or equal to a predetermined reference value. In particular, at 30 MHz or less, it is important to block conduction noise transmitted through a wire, and thus, a CLC filter is used to block such conduction noise (IG noise).

TABLE 1

| Long wave (LW) band | AM band | FM band |
|---|---|---|
| 148 kHz to 300 kHz | 530 kHz to 1.8 MHz | 76 MHz to 108 MHz |

In comparison between FIGS. 4 and 5, in the case of adopting the apparatus for preventing back introduction of electromagnetic wave noise into an IG system according to the present invention, in particular, in a band of 150 kHz to 2 MHz, it is shown that there is an effect of improving the voltage response characteristics for each band. That is, it is shown that, in the case of adopting the apparatus for preventing back introduction of electromagnetic wave noise into an IG system according to the present invention, an intensity of electromagnetic wave introduced into an IG system from a converter is reduced by 10 dBµV as compared with the conventional CLC filter.

Meanwhile, although each of the above-described components has been described as a separate device, this is merely an exemplary description for convenience of description and better understanding, and of course, the components can be implemented in various forms within the scope of the technical spirit of the present invention. For example, the front capacitor module 220 and the central coil module 250 may be integrated and implemented as one module or may be implemented by being divided into two or more devices as in the embodiment of FIG. 2.

According to the present invention, it is possible to prevent back introduction of IG electromagnetic wave noise into a vehicle IG system, thereby preventing malfunction of vehicle electronic components.

Above, the configuration of the present invention has been described in detail through the exemplary embodiments of the present invention. However, the above-described embodiments are merely examples, and do not limit the scope of the present invention. It will be apparent to those skilled in the art that various changes and modifications can be made from the teachings and implications of the present specification without departing from the spirit or scope of the invention Therefore, the protection scope of the present invention should be determined by the description of the accompanying claims.

What is claimed is:

1. An apparatus, as an electromagnetic wave back introduction blocking module connected between an ignition (IG) system and a converter, for preventing back introduction of electromagnetic wave noise into the ignition (IG) system, the apparatus comprising:
   a front capacitor module, which includes a first coil part including one or more coils having one side connected to the IG system in series and a first capacitor part connected between the other side of the first coil part and a ground;
   a central coil module, which includes a second coil part including one or more coils having one side connected to the other side of the first coil part and a second capacitor part connected between the other side of the second coil part and the ground; and
   a rear capacitor module, which includes a third capacitor part having one side connected to the other side of the second coil part, the rear capacitor module being connected to the converter.

2. The apparatus of claim 1, wherein the first capacitor part includes at least two capacitors connected in parallel between the other side of the first coil part and the ground.

3. The apparatus of claim 1, wherein the third capacitor part includes at least two capacitors connected in parallel between the other side of the second coil part and the ground.

4. The apparatus of claim 1, wherein the converter is a low voltage DC-DC converter (LDC).

5. The apparatus of claim 1, wherein the battery module includes at least one 12V battery.

6. The apparatus of claim 1, wherein the converter supports a mild hybrid electric vehicle (MHEV).

7. The apparatus of claim 1, wherein the front capacitor module, the central coil module, and the rear capacitor module are arranged in series between the ignition (IG) system and the converter in an order of the front capacitor module, the central coil module, and the rear capacitor module.

8. The apparatus of claim 1, wherein the converter is configured to convert direct current (DC) power for battery charging, and
   the electromagnetic wave back introduction blocking module is configured to control an operation of transmitting direct current (DC) power for battery charging to the battery module from the converter.

* * * * *